United States Patent
Lee

(10) Patent No.: US 11,610,636 B2
(45) Date of Patent: Mar. 21, 2023

(54) MEMORY DEVICE AND METHOD OF GENERATING AN INTERNAL VOLTAGE WHEN AN ERROR OCCURRED DURING STANDBY MODE

(71) Applicant: SK hynix Inc., Icheon-si Gyeonggi-do (KR)

(72) Inventor: Myung Hwan Lee, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 246 days.

(21) Appl. No.: 17/063,365

(22) Filed: Oct. 5, 2020

(65) Prior Publication Data

US 2021/0358558 A1     Nov. 18, 2021

(30) Foreign Application Priority Data

May 13, 2020   (KR) .......................... 10-2020-0057338

(51) Int. Cl.
    *G11C 16/30*       (2006.01)
(52) U.S. Cl.
    CPC .................................. *G11C 16/30* (2013.01)
(58) Field of Classification Search
    CPC .................................................. G11C 16/30
    See application file for complete search history.

(56) References Cited

U.S. PATENT DOCUMENTS

| | | | | |
|---|---|---|---|---|
| 7,049,797 B2 * | 5/2006 | Fukui | ........................ | G05F 1/56 |
| | | | | 323/281 |
| 7,099,223 B2 * | 8/2006 | Do | .......................... | G11C 5/145 |
| | | | | 365/189.09 |
| 7,688,667 B2 * | 3/2010 | Cha | .......................... | G11C 5/14 |
| | | | | 327/543 |
| 8,866,521 B2 * | 10/2014 | Lee | .......................... | G11C 5/14 |
| | | | | 363/59 |
| 9,202,530 B2 * | 12/2015 | Jang | ......................... | G11C 5/14 |

FOREIGN PATENT DOCUMENTS

| KR | 100902054 B1 | 6/2009 |
|---|---|---|
| KR | 1020120036435 A | 4/2012 |
| KR | 1020120109730 A | 10/2012 |

* cited by examiner

*Primary Examiner* — Vanthu T Nguyen

(74) *Attorney, Agent, or Firm* — William Park & Associates Ltd.

(57) ABSTRACT

Provided herein is a memory device and a method of operating the memory device. The memory device includes: a reference voltage generation circuit configured to generate a standby mode reference voltage in a standby mode, and generate and output an active mode reference voltage in an active mode; and an internal voltage generation circuit configured to receive the standby mode reference voltage or the active mode reference voltage from the reference voltage generation circuit, and generate an internal voltage. When an error is detected from the internal voltage generated in the standby mode, the reference voltage generation circuit may generate and output the active mode reference voltage.

20 Claims, 8 Drawing Sheets

MEMORY DEVICE AND METHOD OF GENERATING AN INTERNAL VOLTAGE WHEN AN ERROR OCCURRED DURING STANDBY MODE

CROSS-REFERENCE TO RELATED APPLICATION

The present application claims priority under 35 U.S.C. § 119(a) to Korean patent application number 10-2020-0057338, filed on May 13, 2020, in the Korean Intellectual Property Office, the entire disclosure of which is incorporated herein by reference.

BACKGROUND

1. Technical Field

Various embodiments of the present disclosure relate to an electronic device, and more particularly, to a memory device and a method of operating the memory device.

2. Related Art

Interest in and importance of memory devices are increasingly growing with increased use of mobile information devices, in particular, smart phones, tablet PCs, etc., using a memory system as a storage medium.

Due not only to parallelization using a high-speed processor or multi-core but also to development of various applications, the required level of the semiconductor memory systems is increasing in terms of reliability as well as performance.

Memory systems are memory devices embodied using a semiconductor such as silicon (Si), germanium (Ge), gallium arsenide (GaAs), indium phosphide (InP), or the like. The memory systems are classified into volatile memory devices and nonvolatile memory devices. Volatile memory devices are a memory device in which data stored therein is lost when power is interrupted. Representative examples of the volatile memory devices include a static RAM (SRAM), a dynamic RAM (DRAM), and a synchronous DRAM (SDRAM). Nonvolatile memory devices are a memory device which retains data stored therein even when power is interrupted. Representative examples of the nonvolatile memory devices include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). Flash memory is classified into NOR type and NAND type memory.

A data storage device using a memory system provides advantages in that, since there is no mechanical driving part, stability and durability are excellent, an information access speed is increased, and power consumption is reduced. Examples of a data storage device proposed as the memory system having such advantages may include a universal serial bus (USB) memory device, a memory card having various interfaces, and a solid state drive (SSD).

SUMMARY

An embodiment of the present disclosure may provide for a memory device including: a reference voltage generation circuit configured to generate a standby mode reference voltage in a standby mode, and generate and output an active mode reference voltage in an active mode; and an internal voltage generation circuit configured to receive the standby mode reference voltage or the active mode reference voltage from the reference voltage generation circuit, and generate an internal voltage. When an error is detected from the internal voltage generated in the standby mode, the reference voltage generation circuit may generate and output the active mode reference voltage.

An embodiment of the present disclosure may provide for a memory device including: a reference voltage generation circuit configured to generate a standby mode reference voltage in a standby mode, and generate and output an active mode reference voltage in an active mode; an internal voltage generation circuit configured to receive the standby mode reference voltage or the active mode reference voltage from the reference voltage generation circuit, and generate an internal voltage; and an internal circuit configured to be driven using the internal voltage and perform a program operation, a read operation, an erase operation, and a test operation. When an error is detected from the internal voltage generated in the standby mode, the reference voltage generation circuit may automatically generate the active mode reference voltage in the standby mode.

An embodiment of the present disclosure may provide for a method of operating a memory device, including: generating a standby mode reference voltage when in a standby mode; generating an internal voltage using the standby mode reference voltage; detecting whether an error is present in the internal voltage by comparing the internal voltage and a comparison voltage; when the error is detected from the internal voltage, disabling an operation of generating the standby mode reference voltage and generating the active mode reference voltage; and generating the internal voltage using the active mode reference voltage.

DETAILED DESCRIPTION

Specific structural or functional descriptions in the embodiments of the present disclosure introduced in this specification or application are only for description of the embodiments of the present disclosure. The descriptions should not be construed as being limited to the embodiments described in the specification or application.

In the description of the following embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

Various embodiments of the present disclosure may be directed to a memory device in which an internal voltage is generated in a standby mode and an active mode so that the operation of the memory device can be reliably performed, and a method of operating the memory device.

Figure 1:
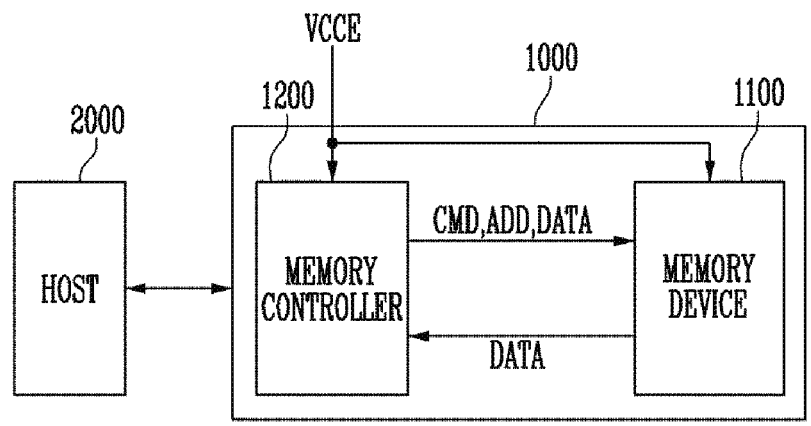
FIG. 1 is a block diagram illustrating a memory system in accordance with an embodiment of the present disclosure.

FIG. 1 is a block diagram illustrating a memory system 1000 in accordance with an embodiment of the present disclosure.

Referring to FIG. 1, the memory system 1000 may include a memory device 1100 configured to store data, and a memory controller 1200 configured to control the memory device 1100 under control of a host 2000.

The host 2000 may use, to communicate with the memory system 1000, an interface protocol such as a PCI-E (peripheral component interconnect-express), an ATA (advanced technology attachment), an SATA (serial ATA), a PATA (parallel ATA) or an SAS (serial attached SCSI). In addition, the interface protocol provided for the purpose of data communication between the host 2000 and the memory system 1000 is not limited to the foregoing examples, and it may be any one of interface protocols such as a universal serial bus (USB) protocol, a multi-media card (MMC) protocol, an enhanced small disk interface (ESDI) protocol, and an integrated drive electronics (IDE) protocol.

The memory device 1100 may operate under control of the memory controller 1200. In an embodiment, the memory device 1100 may be a flash memory device.

The memory device 1100 may receive a command CMD and an address ADD from the memory controller 1200 through a channel, and access an area of the memory cell array that is selected by the address ADD. In other words, the memory device 1100 may perform an internal operation corresponding to the command CMD on the area selected by the address ADD. For example, the memory device 1100 may perform a program operation on a selected memory block in response to a command CMD, an address ADD, and data DATA that correspond to the program operation. Furthermore, the memory device 1100 may perform a read operation on a selected memory block in response to a command CMD and an address ADD that correspond to the read operation. The read data DATA may be output to the memory controller 1200. The memory device 1100 may perform a test operation of the memory device 1100 in response to a command CMD and an address ADD that correspond to the test operation.

The memory controller 1200 may control the overall operation of the memory system 1000 and data exchange between the host 2000 and the memory device 1100. For instance, the memory controller 1200 may control the memory device 1100 to program or read data or erase the programmed data, in response to a request of the host 2000. For example, the memory controller 1200 may output a command CMD, an address ADD, and data DATA that correspond to each overall operation to the memory device 1100 in response to a request from the host 2000, and may receive data DATA from the memory device 1100 and output the data DATA to the host 2000.

The memory device 1100 and the memory controller 1200 may be supplied with an external power supply voltage VCCE and operated using the external power supply voltage VCCE. For example, the memory device 1100 may receive the external power supply voltage VCCE and generate at least one or more internal voltages, and may perform overall operations using the at least one or more internal voltages.

Although in an embodiment of the present disclosure the memory system 1000 is illustrated and described as including one memory device 1100, the memory system 1000 may include a plurality of memory devices 1100. The memory device 1100 may be operated in a standby mode to reduce power consumption in a power-up period. For example, the memory device 1100 may generate a standby mode reference voltage during the power-up period, and generate an internal voltage using the standby mode reference voltage. Furthermore, the memory device 1100 may be operated in an active mode during an overall operation after the power-up period. For example, the memory device 1100 may generate an active mode reference voltage, and generate an internal voltage using the active mode reference voltage.

In the case where an error occurs during an operation of generating the standby mode reference voltage in the power-up period of the memory device 1100, an internal voltage may not be normally generated. Hence, an operation of receiving a command CMD for controlling the memory device 1100 and overall operations of the memory device 1100 may not be normally operated.

In an embodiment of the present disclosure, the memory device 1100 may be operated in the standby mode during the power-up period and generate a standby mode reference voltage, and may generate an internal voltage using the standby mode reference voltage. If the generated internal voltage does not reach a target level, the memory device 1100 may generate, in the standby mode, an active mode reference voltage in lieu of the standby mode reference voltage, and generate an internal voltage using the active mode reference voltage.

Figure 2:
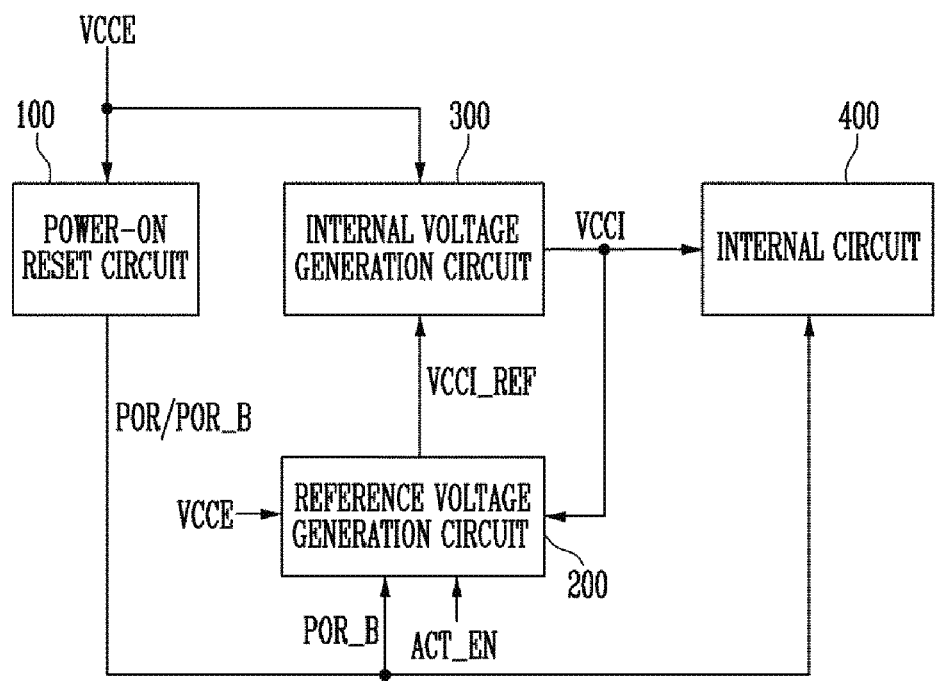
FIG. 2 is a block diagram illustrating a memory device in accordance with an embodiment of the present disclosure.

FIG. 2 is a block diagram illustrating a memory device 1100 in accordance with an embodiment of the present disclosure.

Referring to FIG. 2, the memory device 1100 may include a power-on reset circuit 100, a reference voltage generation circuit 200, an internal voltage generation circuit 300, and an internal circuit 400.

The power-on reset circuit 100 may detect a potential level of the external power supply voltage VCCE, and then generate and output a power-on reset signal POR and an inverted power-on reset signal POR_B. For example, the power-on reset circuit 100 may generate and output a power-on reset signal POR which toggles when the potential level of the external power supply voltage VCCE increases to a set level or more during the power-up operation of the memory system.

The reference voltage generation circuit 200 may receive the external power supply voltage VCCE and generate a reference voltage VCCI_REF. For example, the reference voltage generation circuit 200 may be operated in the standby mode in response to an inverted power-on reset signal PRO_B in the power-up period, and generate a standby mode reference voltage when in the standby mode and output the standby mode reference voltage as the reference voltage VCCI_REF. The reference voltage generation circuit 200 may be operated in the active mode in response to an active signal ACT_EN, and generate an active mode reference voltage when in the active mode and output the active mode reference voltage as the reference voltage VCCI_REF.

The reference voltage generation circuit 200 may compare, when in the standby mode, an internal voltage VCCI generated from the internal voltage generation circuit 300 with a comparison voltage having a target level. When the internal voltage VCCI is lower than the comparison voltage, the reference voltage generation circuit 200 may operate in the active mode to generate an active mode reference voltage, and output the active mode reference voltage as the reference voltage VCCI_REF.

The internal voltage generation circuit 300 may receive the external power supply voltage VCCE and the reference voltage VCCI_REF and generate an internal voltage VCCI, and then output the internal voltage VCCI to the reference voltage generation circuit 200 and the internal circuit 400.

The internal circuit 400 may be initialized in response to a power-on reset signal POR output from the power-on reset circuit 100. Furthermore, the internal circuit 400 may operate using the internal voltage VCCI generated from the internal voltage generation circuit 300 as supply power, and perform overall operations such as a program operation of storing the data, a read operation of reading the stored data, an erase operation of erasing the stored data, and a test operation for the memory device, in response to a command, an address, and pieces of data that are received from the memory controller 1200 of FIG. 1.

Figure 3:
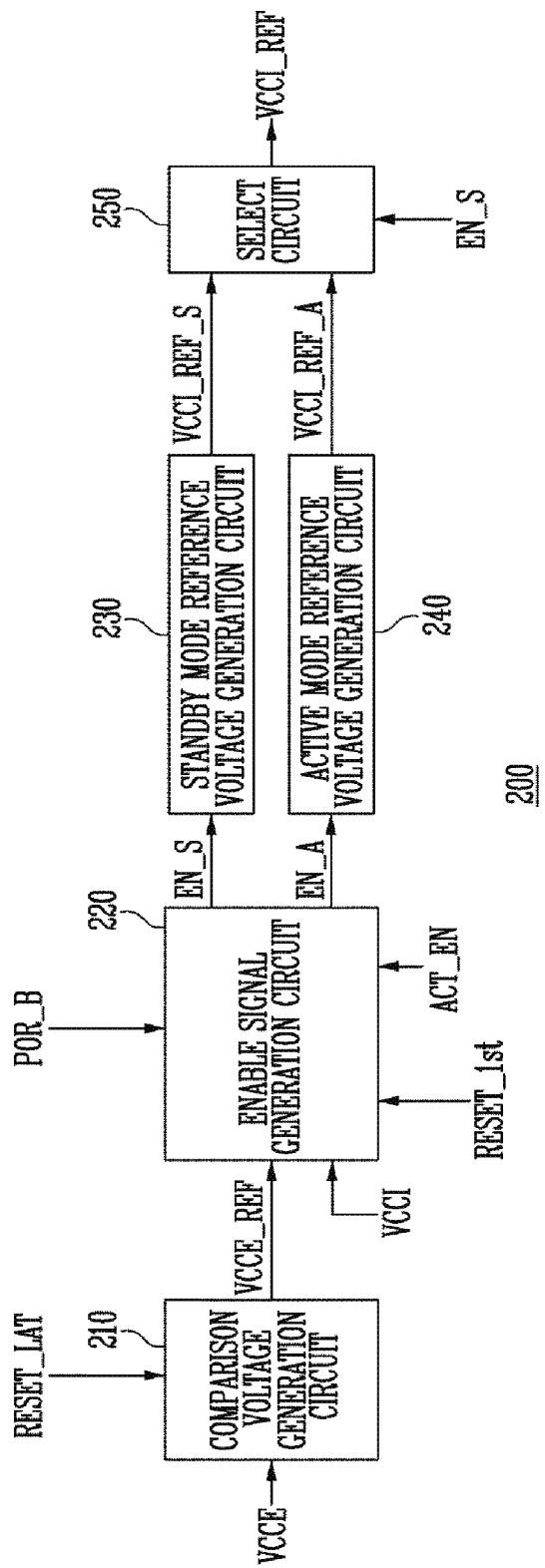
FIG. 3 is a block diagram illustrating a reference voltage generation circuit of FIG. 2.

FIG. 3 is a block diagram illustrating the reference voltage generation circuit 200 of FIG. 2.

Referring to FIG. 3, the reference voltage generation circuit 200 may include a comparison voltage generation circuit 210, an enable signal generation circuit 220, a standby mode reference voltage generation circuit 230, an active mode reference voltage generation circuit 240, and a select circuit 250.

The comparison voltage generation circuit 210 may be enabled in response to a reset latch signal RESET_LAT, and receive an external power supply voltage VCCE and generate a comparison voltage VCCE_REF. The reset latch signal RESET_LAT may be a signal which is enabled in the power-up period of the memory device and is disabled in response to a reset signal received from an external device of the memory device to perform a reset operation of the memory device after the power-up period.

The enable signal generation circuit 220, when in the standby mode, may generate and output a standby mode enable signal EN_S in response to an inverted power-on reset signal POR_B. Furthermore, the enable signal generation circuit 220, when in the active mode, may generate and output an active mode enable signal EN_A in response to an active signal ACT_EN. The enable signal generation circuit 220 may compare, when in the standby mode, the comparison voltage VCCE_REF with the internal voltage VCCI in response to a first reset signal RESET_1st, and continuously generate and output the standby mode enable signal EN_S based on a result of the comparison, or disable the standby mode enable signal EN_S and generate and output the active mode enable signal EN_A. For example, when the internal voltage VCCI generated in the standby mode is equal to or higher than the comparison voltage VCCE_REF, the enable signal generation circuit 220 may continuously enable and output the standby mode enable signal EN_S. When the internal voltage VCCI generated in the standby mode is lower than the comparison voltage VCCE_REF, the enable signal generation circuit 220 may disable the standby mode enable signal EN_S and enable and output the active mode enable signal EN_A.

The standby mode reference voltage generation circuit 230 may generate and output a standby mode reference voltage VCCI_REF_S in response to the standby mode enable signal EN_S.

The active mode reference voltage generation circuit 240 may generate and output an active mode reference voltage VCCI_REF_A in response to the active mode enable signal EN_A.

The select circuit 250 may output the standby mode reference voltage VCCI_REF_S generated from the standby mode reference voltage generation circuit 230 as the reference voltage VCCI_REF in response to the standby mode enable signal EN_S, or output the active mode reference voltage VCCI_REF_A generated from the active mode reference voltage generation circuit 240 as the reference voltage VCCI_REF. For example, the select circuit 250 may output the standby mode reference voltage VCCI_REF_S as the reference voltage VCCI_REF when the standby mode enable signal EN_S is enabled, and output the active mode reference voltage VCCI_REF_A as the reference voltage VCCI_REF when the standby mode enable signal EN_S is disabled.

Figure 4:
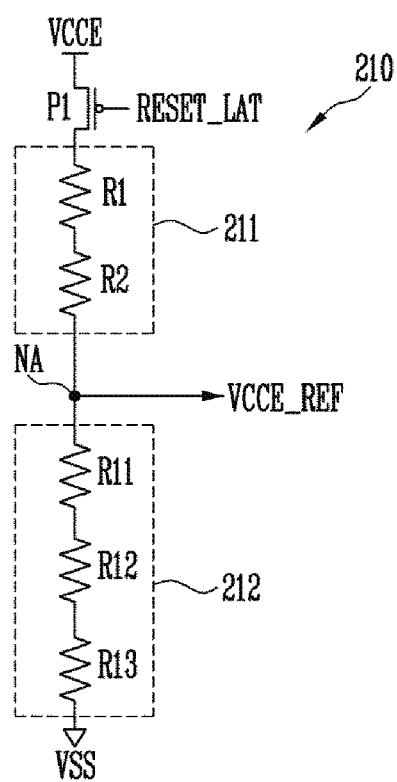
FIG. 4 is a circuit diagram for describing an embodiment of a comparison voltage generation circuit of FIG. 3.

FIG. 4 is a circuit diagram for describing an embodiment of the comparison voltage generation circuit 210 of FIG. 3.

Referring to FIG. 4, the comparison voltage generation circuit 210 may include a PMOS transistor P1, a first resistance stage 211, and a second resistance stage 212.

The PMOS transistor P1 may be coupled between a terminal to which the external power supply voltage VCCE is applied and one end of the first resistance stage 211, and supply the external power supply voltage VCCE to the first resistance stage 211 in response to the reset latch signal RESET_LAT.

The first resistance stage 211 may be coupled between the PMOS transistor P1 and an output node NA, and include at least one or more resistors R1 and R2.

The second resistance stage 212 may be coupled between the output node NA and a ground power supply terminal VSS, and include at least one or more resistors R11 to R13.

When the reset latch signal RESET_LAT is enabled to a logic low level, the comparison voltage generation circuit 210 may be supplied with the external power supply voltage VCCE and thus enabled. The comparison voltage generation circuit 210 may output a comparison voltage VCCE_REF by voltage-distributing the received external power supply voltage VCCE based on a ratio between a resistance value of the first resistance stage 211 and a resistance value of the second resistance stage 212.

In the comparison voltage generation circuit 210, the potential level of the comparison voltage VCCE_REF may be changed depending on the potential level of the external power supply voltage VCCE.

Figure 5:
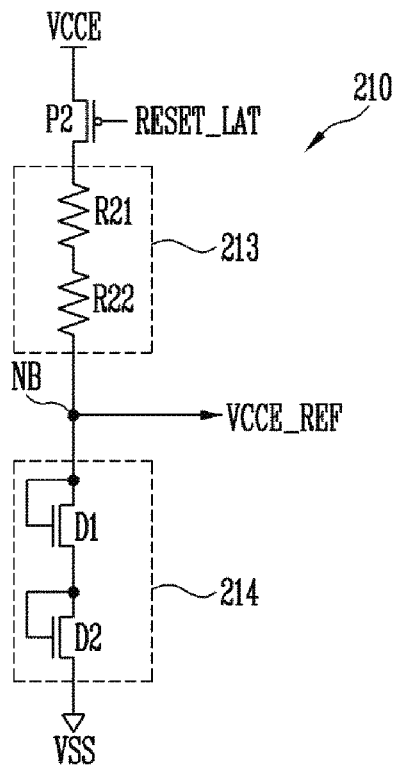
FIG. 5 is a circuit diagram for describing an embodiment of the comparison voltage generation circuit of FIG. 3.

FIG. 5 is a circuit diagram for describing an embodiment of the comparison voltage generation circuit 210 of FIG. 3.

Referring to FIG. 5, the comparison voltage generation circuit 210 may include a PMOS transistor P2, a first resistance stage 213, and a second resistance stage 214.

The PMOS transistor P2 may be coupled between a terminal to which the external power supply voltage VCCE is applied and one end of the first resistance stage 213, and supply the external power supply voltage VCCE to the first resistance stage 213 in response to the reset latch signal RESET_LAT.

The first resistance stage 213 may be coupled between the PMOS transistor P2 and an output node NB, and include at least one or more resistors R21 and R22.

The second resistance stage 214 may be coupled between the output node NB and a ground power supply terminal VSS, and include at least one or more diode connection transistors D1 and D2.

When the reset latch signal RESET_LAT is enabled to the logic low level, the comparison voltage generation circuit 210 may be supplied with the external power supply voltage VCCE and thus enabled. The comparison voltage generation circuit 210 may output a comparison voltage VCCE_REF by voltage-distributing the received external power supply voltage VCCE based on a ratio between a resistance value of the first resistance stage 214 and a resistance value of the second resistance stage 214. The resistance value of the second resistance stage 214 may be changed depending on the potential level of the output node NB. For example, as the potential level of the output node NB is comparatively increased, the resistance value of the second resistance stage 214 is relatively reduced. As the potential level of the output node NB is comparatively reduced, the resistance value of the second resistance stage 214 is relatively increased. Hence, even when the potential level of the external power supply voltage VCCE is changed, the comparison voltage generation circuit 210 may maintain a constant potential level of the output node NB and thus output a comparison voltage VCCE_REF having a constant potential level.

Figure 6:
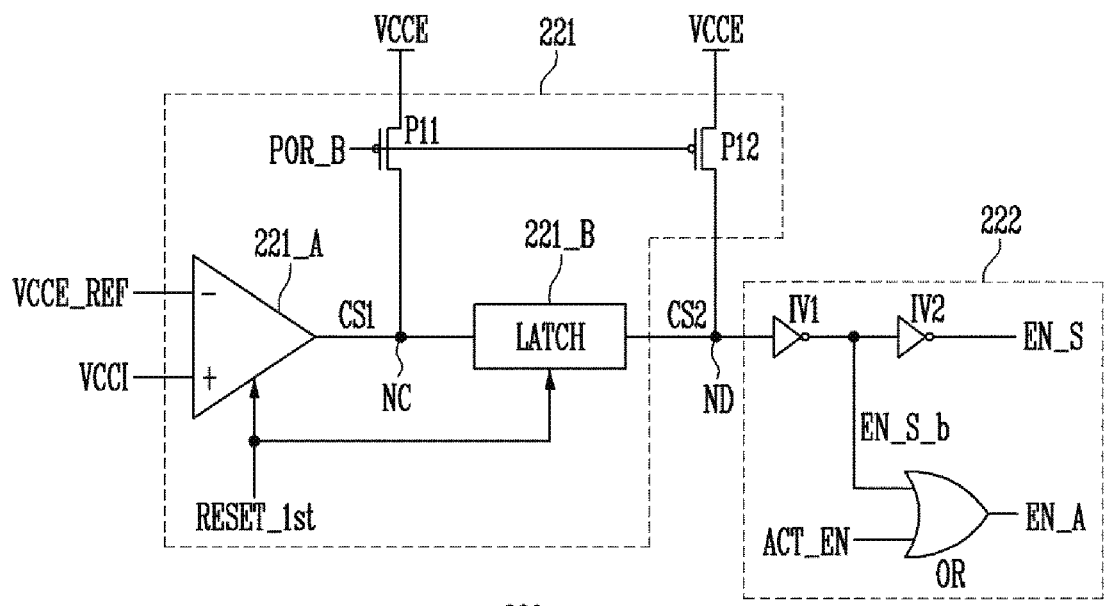
FIG. 6 is a circuit diagram for describing an enable signal generation circuit of FIG. 3.

FIG. 6 is a circuit diagram for describing the enable signal generation circuit 220 of FIG. 3.

Referring to FIG. 6, the enable signal generation circuit 220 may include a mode changer 221 and an enable signal generator 222.

The mode changer 221 may include a comparator 221_A, a latch 221_B, and a plurality of PMOS transistors P11 and P12.

The comparator 221_A may be enabled in response to the first reset signal REST_1st, and include a first input terminal (−) configured to receive the comparison voltage VCCE_REF, and a second input terminal (+) configured to receive the internal voltage VCCI. The comparator 221_A may compare the comparison voltage VCCE_REF with the internal voltage VCCI and output a comparison signal CS1 (i.e., output signal) to a first internal node NC. For example, when the internal voltage VCCI is higher in potential level than the comparison voltage VCCE_REF, the comparator 221_A may generate and output a comparison signal CS1 having a logic high level. When the internal voltage VCCI is lower in potential level than the comparison voltage VCCE_REF, the comparator 221_A may generate and output a comparison signal CS1 having a logic low level.

The latch 221_B may be enabled in response to the first reset signal RESET_1st, and receive and temporarily store the comparison signal CS1 and then output a comparison signal CS2 to a second internal node ND.

The PMOS transistor P11 is coupled between a terminal of the external power supply voltage VCCE and the first internal node NC, and may initialize the first internal node NC by supplying the external power supply voltage VCCE to the first internal node NC in response to an inverted power-on reset signal POR_B.

The PMOS transistor P12 is coupled between a terminal of the external power supply voltage VCCE and the second internal node ND, and may initialize the second internal node ND by supplying the external power supply voltage VCCE to the second internal node ND in response to an inverted power-on reset signal POR_B.

The mode changer 221 may initialize the first internal node NC and the second internal node ND to a logic high level in response to the inverted power-on reset signal POR_B in the standby mode and thus output a comparison signal CS2 having a logic high level.

Furthermore, the mode changer 221 may compare the comparison voltage VCCE_REF with the internal voltage VCCI during a period of the standby mode in which the first reset signal RESET_1st is enabled to a logic high level, and generate and output the comparison signal CS2 based on a result of the comparison. For example, when the internal voltage VCCI is higher in potential level than the comparison voltage VCCE_REF during a period of the standby mode in which the first reset signal RESET_1st is enabled to the logic high level and received, the mode changer 221 may generate and output a comparison signal CS2 having the logic high level. When the internal voltage VCCI is lower in potential level than the comparison voltage VCCE_REF, the mode changer 221 may generate and output a comparison signal CS2 having a logic low level.

The enable signal generator 222 may include at least two inverters IV1 and IV2 and a logic gate OR.

The at least two inverters IV1 and IV2 are coupled in series to the second internal node ND, and may buffer the comparison signal CS2 and output a standby mode enable signal EN_S. For example, in the case where the comparison signal CS2 having the logic high level is received, the at least two inverters IV1 and IV2 may buffer the comparison signal CS2 having the logic high level and output a standby mode enable signal EN_S to be enabled to a logic high level. Furthermore, in the case where the comparison signal CS2 having the logic low level is received, the at least two inverters IV1 and IV2 may buffer the comparison signal CS2 having the logic low level and output a standby mode enable signal EN_S to be disabled to a logic low level.

The logic gate OR may generate and output an active mode enable signal EN_A in response to an output signal EN_S_b of the inverter IV1 or the active signal ACT_EN. For example, when an output signal EN_S_b (i.e., inverted signal of the standby mode enable signal) having a logic high level or an active signal ACT_EN having the logic high level is received, the logic gate OR may generate and output an active mode enable signal EN_A to be enabled to the logic high level.

The enable signal generation circuit 220 may output a standby mode enable signal EN_S to be enabled to the logic high level in response to an inverted power-on reset signal POR_B in the standby mode. Thereafter, in the period in which the first reset signal RESET_1st is enabled to the logic high level and received, the internal voltage VCCI may be compared with the comparison voltage VCCE_REF. As a result of the comparison, if the internal voltage VCCI is higher in potential level than the comparison voltage VCCE_REF, the standby mode enable signal EN_S to be enabled to the logic high level may be continuously output. As a result of the comparison of the internal voltage VCCI with the comparison voltage VCCE_REF, if the internal voltage VCCI is lower than the comparison voltage VCCE_REF, the standby mode enable signal EN_S may be disabled to the logic low level, and the active mode enable signal EN_A may be enabled to the logic high level and be output.

Furthermore, when in the active mode, the enable signal generation circuit 220 may enable the active mode enable signal EN_A to the logic high level in response to an active signal ACT_EN, and then output the enabled active mode enable signal EN_A.

Figure 7:
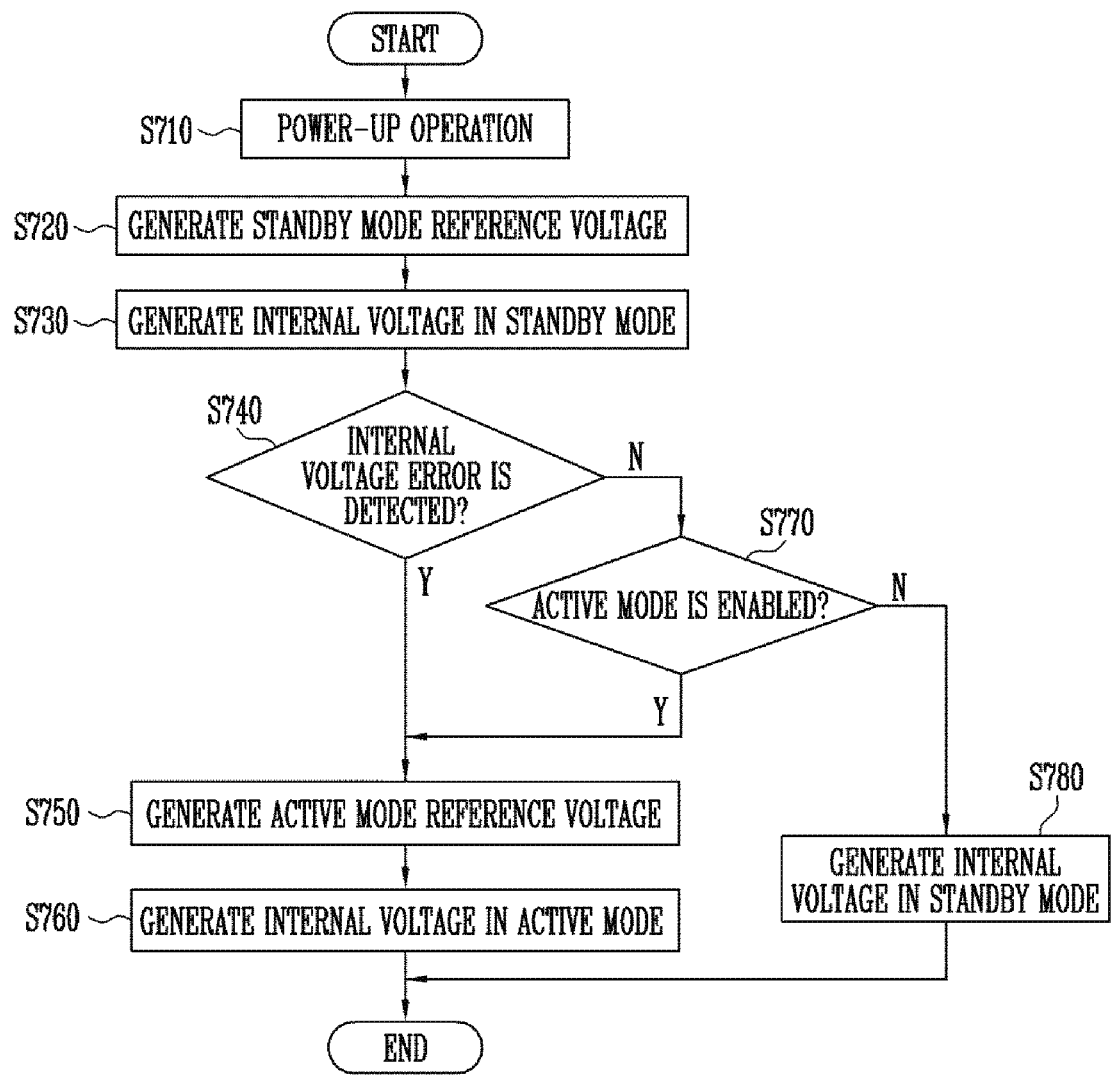
FIG. 7 is a flowchart illustrating a method of operating a memory device in accordance with an embodiment of the present disclosure.

FIG. 7 is a flowchart illustrating a method of operating the memory device in accordance with an embodiment of the present disclosure.

Figure 8:
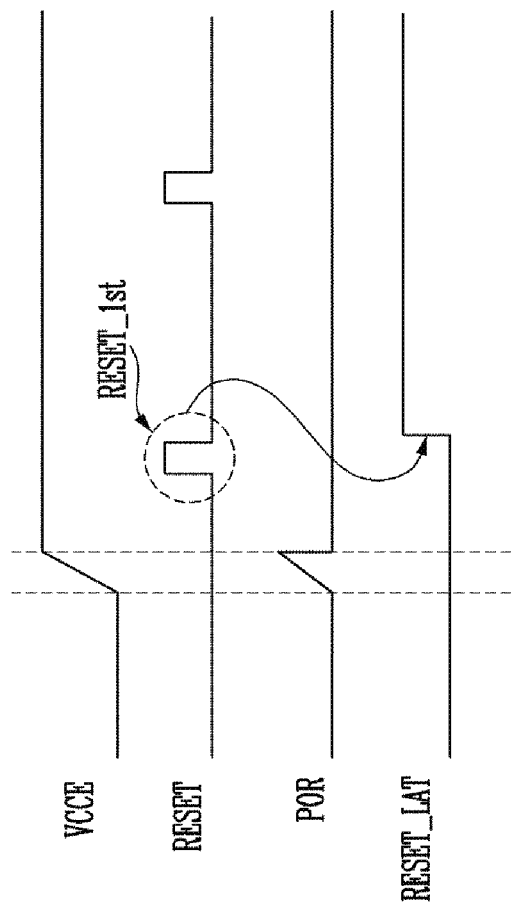
FIG. 8 is a waveform diagram of signals for describing a method of operating the memory device in accordance with an embodiment of the present disclosure.

FIG. 8 is a waveform diagram of signals for describing a method of operating the memory device in accordance with an embodiment of the present disclosure.

The method of operating the memory system in accordance with an embodiment of the present disclosure will be described with reference to FIGS. 1 to 8.

In an embodiment of the present disclosure, there will be described an example where an internal voltage is generated in the standby mode during the power-up period and a test operation is performed by driving the internal circuit of the memory device using the generated internal voltage.

At step S710, an external power supply voltage VCCE may be supplied to the memory system 1000. The memory device 1100 may receive the external power supply voltage VCCE and perform a power-on operation.

The power-on reset circuit 100 may generate and output a power-on reset signal POR which toggles when the external power supply voltage VCCE increases to a set level or more during the power-up operation. In other words, the power-on reset signal POR may increase with increase of the external power supply voltage VCCE, and make a transition to a low level when the external power supply voltage VCCE increases to the set level or more. Furthermore, the power-on reset circuit 100 may generate and output an inverted power-on reset signal POR_B having a logic signal inverted to the power-on reset signal POR.

At step S720, the reference voltage generation circuit 200 may generate a standby mode reference voltage VCCI_REF_S in response to the inverted power-on reset signal POR_B.

For example, the mode changer 221 of the enable signal generation circuit 220 may output a comparison signal CS2 having the logic high level in response to the inverted power-on reset signal POR_B. The enable signal generator 222 may generate and output a standby mode enable signal EN_S in response to the comparison signal CS2 having the logic high level. The standby mode reference voltage generation circuit 230 may generate and output a standby mode reference voltage VCCI_REF_S in response to the standby mode enable signal EN_S.

At step S730, the internal voltage generation circuit 300 may generate an internal voltage VCCI using the reference voltage VCCI_REF generated in the standby mode. The internal circuit 400 may be operated in the standby mode using the internal voltage VCCI. For example, the standby mode may be a waiting mode for receiving a command CMD from the memory controller 1200.

For example, the select circuit 250 of the reference voltage generation circuit 200 may output the standby mode reference voltage VCCI_REF_S as the reference voltage VCCI_REF. The internal voltage generation circuit 300 may receive the standby mode reference voltage VCCI_REF_S as the reference voltage VCCI_REF and generate the internal voltage VCCI.

At step S740, the reference voltage generation circuit 200 may detect whether an error is present in the internal voltage VCCI generated from the internal voltage generation circuit 300.

For example, the comparison voltage generation circuit 210 may be enabled in response to a reset latch signal RESET_LAT, and receive an external power supply voltage VCCE and generate a comparison voltage VCCE_REF. The reset latch signal RESET_LAT may be a signal which is enabled in the power-up period of the memory device 1100, and is disabled in response to a first reset signal RESET_1st that is first received among reset signals RESET received from an external device of the memory device 100, e.g., from the memory controller 1200, to perform a reset operation of the memory device 1100 after the power-up period.

The enable signal generation circuit 220 may be enabled in response to the first reset signal RESET_1st, and compare the comparison voltage VCCE_REF with the internal voltage VCCI. As a result of the comparison, if the internal voltage VCCI is higher than the comparison voltage VCCE_REF, the enable signal generation circuit 220 may determine that it is normal. If the internal voltage VCCI is lower than the comparison voltage VCCE_REF, the enable signal generation circuit 220 may determine that an error is present in the internal voltage VCCI, and detect the error.

As a result of the detection of step S740, if the internal voltage VCCI is lower than the comparison voltage VCCE_REF and it is determined that an error has occurred in the internal voltage VCCI (refer to 'Y'), an active mode reference voltage VCCI_REF_A is generated at step S750.

For example, if the internal voltage VCCI is lower than the comparative voltage VCCE_REF, the enable signal generation circuit 220 may disable the standby mode enable signal EN_S and enable and output the active mode enable signal EN_A.

The active mode reference voltage generation circuit 240 may generate and output an active mode reference voltage VCCI_REF_A in response to the active mode enable signal EN_A.

At step S760, the internal voltage generation circuit 300 may generate an internal voltage VCCI using the reference voltage VCCI_REF generated in the active mode. The internal circuit 400 may be operated in the standby mode using the internal voltage VCCI.

For example, the select circuit 250 of the reference voltage generation circuit 200 may output the active mode reference voltage VCCI_REF_A as the reference voltage VCCI_REF. The internal voltage generation circuit 300 may receive the active mode reference voltage VCCI_REF_A as the reference voltage VCCI_REF and generate the internal voltage VCCI. Consequently, the internal circuit 400 may be operated in the standby mode using the internal voltage VCCI generated using the active mode reference voltage VCCI_REF_A.

Thereafter, when a command CMD corresponding to a test operation is received from the memory controller 1200, the mode of the memory device 1100 may be changed from the standby mode to the active mode in response to the command CMD. The reference voltage generation circuit 200 may be operated in the active mode in response to an active signal ACT_EN. The internal voltage generation circuit 300 may receive the active mode reference voltage VCCI_REF_A as the reference voltage VCCI_REF, and generate and output the internal voltage VCCI. The internal circuit 400 may perform an overall operation, e.g., a test operation, using the internal voltage VCCI.

As a result of the detection of step S740, if the internal voltage VCCI is higher than the comparison voltage VCCE_REF and it is determined that there is no error in the internal voltage VCCI (refer to 'N'), it is determined whether the active mode has enabled at step S770.

For example, in the case where the memory device 1100 receives a command CMD from the memory controller 1200 when in the standby mode, the active mode may be enabled in response to the received command CMD. If the active mode is enabled, the active signal ACT_EN is enabled and generated.

If at step S770 it is determined that the active mode has been enabled (refer to 'Y'), the above-mentioned operation of step S750 is performed.

If at step S770 it is determined that the active mode is not enabled (refer to 'N'), the internal voltage generation circuit 300 may receive the standby mode reference voltage VCCI_REF_S as the reference voltage VCCI_REF and generate the internal voltage VCCI, at step S780. Consequently, the internal circuit 400 may be operated in the standby mode using the internal voltage VCCI.

As described above, in accordance with an embodiment of the present disclosure, if an error is present in an internal voltage generated in the standby mode, the reference voltage generation circuit may be automatically changed in mode to the active mode and generate a reference voltage, and generate an internal voltage using the reference voltage generated in the active mode. Therefore, the standby mode of the memory device may be reliably operated.

Figure 9:
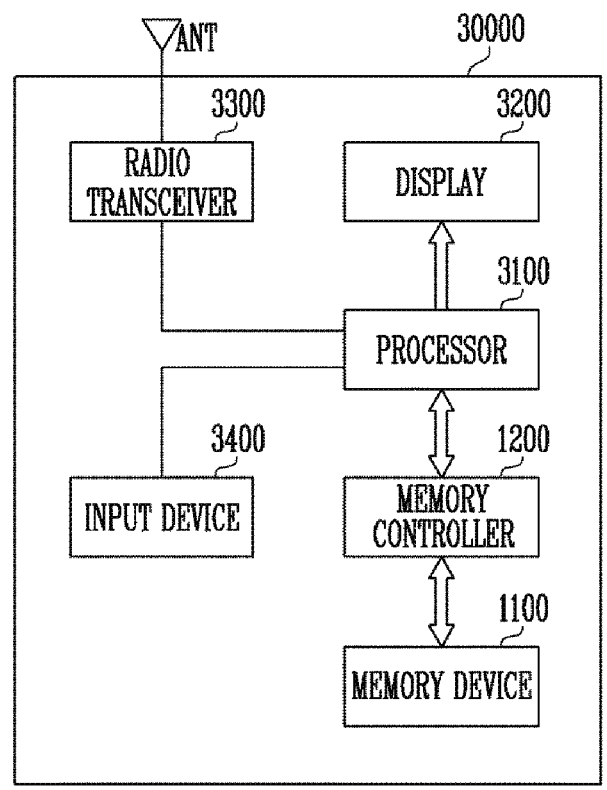
FIG. 9 is a diagram illustrating a memory system in accordance with an embodiment of the present disclosure.

FIG. 9 is a diagram illustrating a memory system 30000 in accordance with an embodiment of the present disclosure.

Referring to FIG. 9, the memory system 30000 may be embodied in a cellular phone, a smartphone, a tablet PC, a personal digital assistant (PDA) or a wireless communication device. The memory system 30000 may include a memory device 1100, and a memory controller 1200 configured to control the operation of the memory device 1100. The memory controller 1200 may control a data access operation, e.g., a program operation, an erase operation, or a read operation, of the memory device 1100 under control of a processor 3100.

Data programmed in the memory device 1100 may be outputted through a display 3200 under control of the memory controller 1200.

A radio transceiver 3300 may send and receive radio signals through an antenna ANT. For example, the radio transceiver 3300 may change a radio signal received through the antenna ANT into a signal capable of being processed in the processor 3100. Therefore, the processor 3100 may process a signal output from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal output from the processor 3100 into a radio signal, and output the changed radio signal to an external device through the antenna ANT. An input device 3400 may be used to input a control signal for controlling the operation of the processor 3100 or data to be processed by the processor 3100. The input device 3400 may be embodied in a pointing device such as a touch pad and a computer mouse, a keypad or a keyboard. The processor 3100 may control the operation of the display 3200 such that data outputted from the memory controller 1200, data outputted from the radio transceiver 3300, or data outputted form the input device 3400 is outputted through the display 3200.

In an embodiment, the memory controller 1200 capable of controlling the operation of the memory device 1100 may be embodied as a part of the processor 3100 or a chip provided separately from the processor 3100. Furthermore, the memory controller 1200 may be implemented as an example of the memory controllers illustrated in FIG. 1. The memory device 1100 may be implemented as an example of the memory devices illustrated in FIG. 1.

Figure 10:
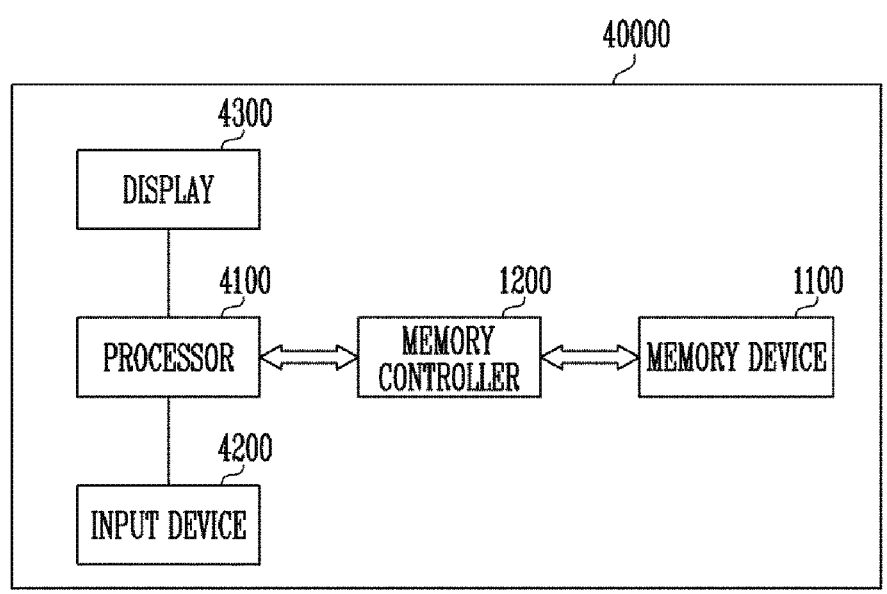
FIG. 10 is a diagram illustrating a memory system in accordance with an embodiment of the present disclosure.

FIG. 10 is a diagram illustrating a memory system 40000 in accordance with an embodiment of the present disclosure.

Referring to FIG. 10, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100, and a memory controller 1200 configured to control the data processing operation of the memory device 1100.

A processor 4100 may output data stored in the memory device 1100 through a display 4300, according to data inputted from an input device 4200. For example, the input device 4200 may be embodied in a pointing device such as a touch pad or a computer mouse, a keypad, or a keyboard.

The processor 4100 may control the overall operation of the memory system 40000 and control the operation of the memory controller 1200. In an embodiment, the memory controller 1200 capable of controlling the operation of the memory device 1100 may be embodied as a part of the processor 4100 or a chip provided separately from the processor 4100. Furthermore, the memory controller 1200 may be implemented as an example of the memory controllers illustrated in FIG. 1. The memory device 1100 may be implemented as an example of the memory devices illustrated in FIG. 1.

Figure 11:
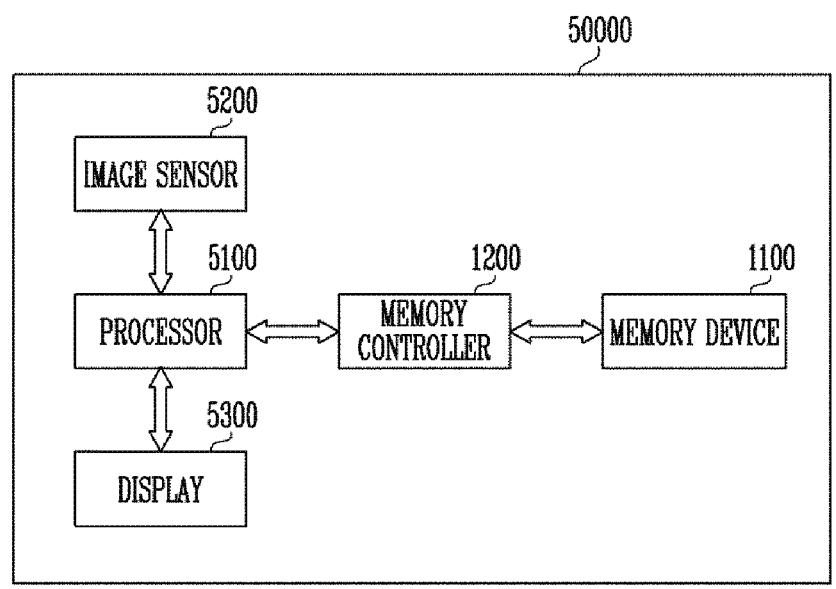
FIG. 11 is a diagram illustrating a memory system in accordance with an embodiment of the present disclosure.

FIG. 11 is a diagram illustrating a memory system 50000 in accordance with an embodiment of the present disclosure.

Referring to FIG. 11, the memory system 50000 may be embodied in an image processing device, e.g., a digital camera, a portable phone provided with a digital camera, a smartphone provided with a digital camera, or a tablet PC provided with a digital camera.

The memory system 50000 may include a memory device 1100, and a memory controller 1200 capable of controlling a data processing operation, e.g., a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be outputted through a display 5300 or stored in the memory device 1100 through the memory controller 1200. Data stored in the memory device 1100 may be outputted through the display 5300 under control of the processor 5100 or the memory controller 1200.

In an embodiment, the memory controller 1200 capable of controlling the operation of the memory device 1100 may be embodied as a part of the processor 5100 or a chip provided separately from the processor 5100. Furthermore, the memory controller 1200 may be implemented as an example of the memory controllers illustrated in FIG. 1. The memory device 1100 may be implemented as an example of the memory devices illustrated in FIG. 1.

Figure 12:
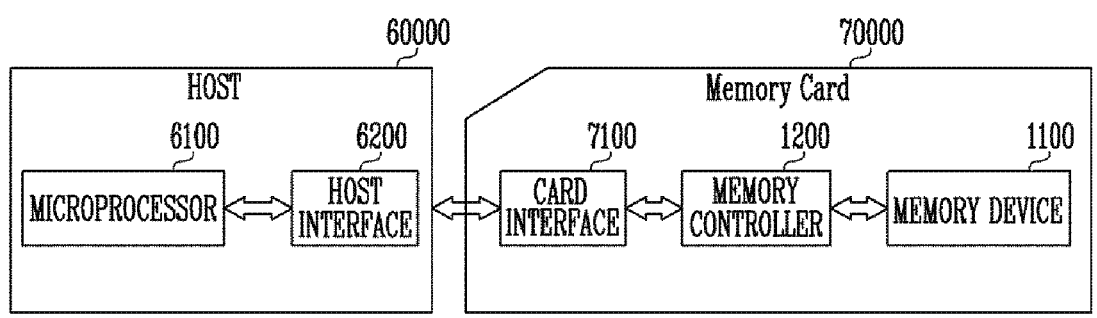
FIG. 12 is a diagram illustrating a memory system in accordance with an embodiment of the present disclosure.

FIG. 12 is a diagram illustrating a memory system 70000 in accordance with an embodiment of the present disclosure.

Referring to FIG. 12, the memory system 70000 may be embodied in a memory card or a smart card. The memory system 70000 may include a memory device 1100, a memory controller 1200, and a card interface 7100.

The controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an interchip (IC)-USB protocol. Here, the card interface may refer to hardware capable of supporting a protocol which is used by the host 60000, software installed in the hardware, or a signal transmission scheme.

When the memory system 70000 is connected to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under control of a microprocessor 6100. Furthermore, the memory controller 1200 may be implemented as an example of the memory controllers illustrated in FIG. 1. The memory device 1100 may be implemented as an example of the memory devices illustrated in FIG. 1.

In various embodiments of the present disclosure, when in a standby mode, a memory device may generate an internal voltage using a standby reference voltage. When an error is detected from the internal voltage, the internal voltage is generated using an active mode reference voltage, so that an internal operation of the memory device can be reliably performed.

While the examples of embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. A memory device comprising:
   a reference voltage generation circuit configured to generate a standby mode reference voltage in a standby mode, and generate and output an active mode reference voltage in an active mode; and
   an internal voltage generation circuit configured to receive one of the standby mode reference voltage and the active mode reference voltage from the reference voltage generation circuit, and generate an internal voltage,
   wherein, when an error is detected from the internal voltage generated in the standby mode, the reference voltage generation circuit generates and outputs the active mode reference voltage.

2. The memory device according to claim 1, wherein, when the internal voltage generated in the standby mode is less than a comparison voltage, the reference voltage generation circuit generates the active mode reference voltage in the standby mode and outputs the active mode reference voltage to the internal voltage generation circuit.

3. The memory device according to claim 2, wherein the reference voltage generation circuit comprises:
   a comparison voltage generation circuit configured to generate the comparison voltage;
   an enable signal generation circuit configured to generate a standby mode enable signal in response to an inverted power-on reset signal when in the standby mode, and generate an active mode enable signal in response to an active signal when in the active mode;
   a standby mode reference voltage generation circuit configured to generate the standby mode reference voltage in response to the standby mode enable signal; and
   an active mode reference voltage generation circuit configured to generate the active mode reference voltage in response to the active mode enable signal.

4. The memory device according to claim 3, wherein the enable signal generation circuit receives and compares the comparison voltage and the internal voltage when in the standby mode, and continuously enables and outputs the standby mode enable signal, or disables the standby mode enable signal and enables and outputs the active mode enable signal, based on a result of the comparison between the comparison voltage and the internal voltage.

5. The memory device according to claim 4,
   wherein, when the internal voltage is greater than the comparison voltage, the enable signal generation circuit continuously enables and outputs the standby mode enable signal, and
   wherein, when the internal voltage is less than the comparison voltage, the enable signal generation circuit disables the standby mode enable signal and enables and outputs the active mode enable signal.

6. The memory device according to claim 3, wherein the reference voltage generation circuit further comprises a select circuit configured to output one of the standby mode reference voltage and the active mode reference voltage to the internal voltage generation circuit in response to the standby mode enable signal.

7. The memory device according to claim 3, wherein the enable signal generation circuit comprises:
   a mode changer configured to generate a comparison signal having a first logic level in response to the inverted power-on reset signal when in the standby mode; and
   an enable signal generator configured to enable and output the standby mode enable signal in response to the comparison signal, or enable and output the active mode enable signal in response to the active signal.

8. The memory device according to claim 7, wherein the mode changer compares the comparison voltage and the internal voltage when in the standby mode, and maintains a logic level of the comparison signal in the first logic level or changes the logic level to a second logic level depending on a result of the comparison.

9. The memory device according to claim 7, wherein the mode changer comprises:
   a comparator configured to compare the comparison voltage and the internal voltage and output an output signal to a first internal node based on a result of the comparison;
   a latch coupled between the first internal node and a second internal node, and configured to latch the output signal and output the comparison signal to the second internal node; and
   a transistor coupled between an external power voltage terminal and the second internal node, and configured to set a logic level of the comparison signal to the first logic level in response to the inverted power-on reset signal.

10. The memory device according to claim 9, wherein the comparator and the latch are enabled in response to a reset signal to be enabled for a predetermined time when in the standby mode.

11. The memory device according to claim 7, wherein the enable signal generator comprises:
    a plurality of inverters configured to buffer the comparison signal and output the standby mode enable signal; and
    a logic gate configured to generate and output the active mode enable signal in response to an inverted signal of the standby mode enable signal and the active signal.

12. A memory device comprising:
a reference voltage generation circuit configured to generate a standby mode reference voltage in a standby mode, and generate and output an active mode reference voltage in an active mode;
an internal voltage generation circuit configured to receive one of the standby mode reference voltage and the active mode reference voltage from the reference voltage generation circuit, and generate an internal voltage; and
an internal circuit configured to be driven using the internal voltage and perform a program operation, a read operation, an erase operation, and a test operation,
wherein, when an error is detected from the internal voltage generated in the standby mode, the reference voltage generation circuit automatically generates the active mode reference voltage in the standby mode.

13. The memory device according to claim 12, wherein the reference voltage generation circuit comprises:
a comparison voltage generation circuit configured to generate a comparison voltage;
an enable signal generation circuit configured to generate a standby mode enable signal in response to an inverted power-on reset signal when in the standby mode, generate an active mode enable signal in response to an active signal when in the active mode, and continuously enable and output the standby mode enable signal, or disable the standby mode enable signal and enable and output the active mode enable signal, based on a result of the comparison between the comparison voltage and the internal voltage;
a standby mode reference voltage generation circuit configured to generate the standby mode reference voltage in response to the standby mode enable signal; and
an active mode reference voltage generation circuit configured to generate the active mode reference voltage in response to the active mode enable signal.

14. The memory device according to claim 13,
wherein, when the internal voltage is greater than the comparison voltage, the enable signal generation circuit continuously enables and outputs the standby mode enable signal, and
wherein, when the internal voltage is less than the comparison voltage, the enable signal generation circuit disables the standby mode enable signal and enables and outputs the active mode enable signal.

15. The memory device according to claim 13, wherein the enable signal generation circuit comprises:
a mode changer configured to generate a comparison signal having a first logic level in response to the inverted power-on reset signal when in the standby mode, or generate a comparison signal having a second logic level based on a result of the comparison between the internal voltage and the comparison voltage; and
an enable signal generator configured to enable and output the standby mode enable signal in response to the comparison signal, or enable and output the active mode enable signal in response to the active signal.

16. The memory device according to claim 15, wherein the mode changer comprises:
a comparator configured to compare the comparison voltage and the internal voltage and output an output signal to a first internal node based on a result of the comparison;
a latch coupled between the first internal node and a second internal node, and configured to latch the output signal and output the comparison signal to the second internal node; and
a transistor coupled between an external power voltage terminal and the second internal node, and configured to set a logic level of the comparison signal to the first logic level in response to the inverted power-on reset signal.

17. The memory device according to claim 15, wherein the enable signal generator comprises:
a plurality of inverters configured to buffer the comparison signal and output the standby mode enable signal; and
a logic gate configured to generate and output the active mode enable signal in response to an inverted signal of the standby mode enable signal and the active signal.

18. A method of operating a memory device, comprising:
generating a standby mode reference voltage when in a standby mode;
generating an internal voltage using the standby mode reference voltage;
detecting whether an error is present in the internal voltage by comparing the internal voltage and a comparison voltage;
when the error is detected from the internal voltage, disabling an operation of generating the standby mode reference voltage and generating the active mode reference voltage; and
generating the internal voltage using the active mode reference voltage.

19. The method according to claim 18, further comprising
when the error is not detected in detecting the error form the internal voltage, determining whether an active mode has been enabled; and
when the active mode is enabled, generating the internal voltage using the active mode reference voltage.

20. The method according to claim 18, wherein the memory device is driven in a waiting mode for receiving a command to be input from an external device using the internal voltage generated when in the standby mode.

* * * * *